United States Patent [19]
Schroen et al.

[11] 3,983,264
[45] Sept. 28, 1976

[54] METAL-SEMICONDUCTOR OHMIC CONTACTS AND METHODS OF FABRICATION

[75] Inventors: Walter H. Schroen; Francois A. Padovani, both of Dallas, Tex.; Hanspeter P. K. Hentzschel, Reutlingen, Germany

[73] Assignee: Texas Instruments Incorporated, Dallas, Tex.

[22] Filed: Jan. 18, 1974

[21] Appl. No.: 434,464

Related U.S. Application Data

[62] Division of Ser. No. 273,553, July 20, 1972, abandoned.

[52] U.S. Cl. ............................ 427/39; 427/88; 427/299; 427/309
[51] Int. Cl.² ...................................... B01D 3/06
[58] Field of Search ............... 117/212; 427/39, 88

[56] References Cited
UNITED STATES PATENTS

| | | | |
|---|---|---|---|
| 3,121,852 | 2/1964 | Boyd et al. | 338/19 |
| 3,298,863 | 1/1961 | McCusker | 117/212 |
| 3,666,548 | 5/1972 | Brack et al. | 117/212 |

OTHER PUBLICATIONS

Dugdale, Glow Discharge Material Processing M&B Monographs (1971) pp. 36–39.

*Primary Examiner*—John D. Welsh
*Attorney, Agent, or Firm*—Harold Levine; James T. Comfort; Gary C. Honeycutt

[57] ABSTRACT

Ohmic contacts to semiconductor surfaces are fabricated by a process which includes the formation of an adherent, uniform insulating film at the interface between the semiconductor surface and the metallization layer. The insulating film contains stationary charges of sign opposite to the sign of the conductivity of the semiconductor whereby image charges are introduced in the semiconductor. These image charges are located near the semiconductor surface and are of sufficient density to induce the formation of an accumulation layer. The minimum charge density required in the insulating layer is determined by the density of the surface states, $Q_{ss}$, in the semiconductor. Minimum $Q_{ss}$ for silicon is about $5 \times 10^{10}$ charges/cm². The structure thus formed will present an electrical resistance resulting almost solely from the tunneling resistance of the insulating layer. Such a resistance is far smaller than the resistance one would observe in a structure consisting only of the semiconductor and metallization layer because the resistance of the structure is dominated by the resistance of the Schottky barrier formed at the metal-semiconductor interface. For example, just prior to metallization, an oxide-masked silicon wafer is subjected to argon ion bombardment for surface cleaning and activation, followed by oxygen ion bombardment for a time sufficient to form a uniform layer of silicon oxide having a thickness on the order of about 20 Angstroms. Subsequent metallization produces a specific contact resistance of about $5 \times 10^{-7}$ ohm-cm² on a silicon region having a resistivity of 1.0 ohm-cm, without previous contact diffusion or subsequent metal-semiconductor annealing.

15 Claims, 2 Drawing Figures

METAL-SEMICONDUCTOR OHMIC CONTACTS AND METHODS OF FABRICATION

This is a division of application Ser. No. 273,553, filed July 20, 1972, now abandoned.

This invention relates to metal-semiconductor contact structures, and to methods for regulating the interface impedance of such structures. More particularly, the invention relates to metal-semiconductor contact structures having a discrete nonconductive layer at the interface between the metal and semiconductor surfaces, wherein charge states are generated locally to produce an accumulation region in the semiconductor.

A metal-semiconductor contact which exhibits linear current voltage characteristics in the first and third quadrant is called "ohmic" when its impedance is negligible in comparison with the series resistance of the semiconductor substrate, and it does not substantially change the equilibrium carrier densities within the semiconductor. Electrons and holes are at their thermal equilibrium values at an ohmic contact. The fabrication of uniform, reliable ohmic contacts has been a persistent problem for all branches of the semiconductor industry and for all types of semiconductors, including silicon, germanium, gallium arsenide, and other III–V compounds. The problem becomes particularly significant when ohmic contacts are to be formed on high resistivity semiconductor regions which, in the case of silicon, refers to a resistivity on the order of about 1.0 ohm-cm or higher.

A Schottky barrier is usually formed when a metal layer is deposited on a semiconductor surface, and is characterized by an impedance due to the barrier height and width, which must be minimized in the formation of ohmic contacts. This is normally achieved by a combination of steps which are intended to optimize current transport across the barrier by tunneling and/or thermionic emission. These steps include "contact diffusion" to provide a localized surface region of very low resistivity, and metal-semiconductor annealing to produce a metal silicide or similar compound and to overcome any residual surface contamination or accidental interface layer. The latter process generates a new interface between the silicide and the semiconductor, which determines for the most part the electrical characteristics of the contact structure. While such contacts are satisfactory for many purposes, they are far from ideal, since they introduce a serious constraint in terms of metallurgical compatibility between the semiconductor and the metal layer. Moreover, it is desirable to eliminate both the contact diffusion step and the high temperature annealing step in order to simplify the overall processing sequence and to completely eliminate high temperature processes. This latter advantage is extremely important for high resistivity semiconductor material.

Accordingly, it is a primary object of the invention to provide a metal-semiconductor contact structure having improved electrical characteristics. It is a further object of the invention to produce an ohmic contact structure by a simplified fabrication method, whereby improved yields are achieved at low temperatures.

One aspect of the invention is embodied in a semiconductor contact structure comprising a semiconductor body having an extremely thin film of adherent nonconductive material thereon, and an adherent film of conductor on the nonconductive film. The nonconductive material is defined as a material presenting a bulk resistivity greater than about $10^6$ ohm-cm.

One other important aspect of the invention is embodied in a semiconductor contact structure comprising a semiconductor-insulator interface with suitable electrical properties to create an accumulation layer in the adjacent semiconductor. This accumulation layer can be induced by either doping the insulator region at or close to (approximately 10 Angstroms depth) the semiconductor surface to introduce fixed charges of proper image or by proper surface treatment of the semiconductor prior to oxide deposition in order to smear the energy distribution of the surface state density. In the first embodiment, the density of the fixed insulating charges and their sign are selected to generate image charges and consequently an accumulation layer in the semiconductor region close to the interface. In other words, the states are occupied by positive charges for an n-type semiconductor and by negative charges for a p-type semiconductor. The charges are supplied readily by thermal processes according to the position of the Fermi-level. The minimum charge density required in the insulating layer is determined by the density of the surface states, $Q_{ss}$, in the semiconductor. In practice values larger than this minimum value (about $1 \times 10^{10}$ charges/cm$^2$ for silicon) will have to be achieved in order to insure device stability.

In the second embodiment of this invention, proper surface treatment has to be performed to achieve quasi uniform smearing of the surface state density energy distribution over the whole energy range bounded by the energies of the top of the valence band and the bottom of the conduction band. This second embodiment is to be preferred in practice since the properties of the final structure do not rely upon localized ions which might move with time.

The insulator interface layer between the semiconductor surface and the metal film represents a tunneling barrier. The tunneling resistance of this interface layer is small, however, compared to the resistance of the Schottky barrier which would result from direct metallization. The charge interface states in the insulator layer transform the depletion region of the adjacent semiconductor into an accumulation region having a negligible resistance compared to the semiconductor spreading resistance, which satisfies the definition of an acceptable ohmic contact.

The invention is applicable to all known semiconductor materials including silicon, germanium, gallium arsenide, gallium aluminum arsenide, gallium arsenide phosphide, and various other compound semiconductors of binary and ternary types. Certain semiconductors, however, are known to have unusually high surface state densities, compared with silicon. In such instances it will be necessary for best results to reduce the surface state density of the semiconductor to an appropriate level before completing the contact structure of the invention. In a preferred embodiment, the invention is applicable to silicon having a high resistivity, in the range of 1–10,000 ohm-cm and higher. The invention is particularly applicable to the formation of ohmic contacts to high resistivity silicon of n-type conductivity since, from a practical viewpoint, the incentives to develop improved contacts have proven most immediate in this area because of the n-type epitaxial material most commonly used in digital integrated circuits.

The adherent film of nonconductive material must have a thickness in the range of about 10–100 Angstroms. A film less than 10 A thick is unsatisfactory due to lack of uniformity or operating stability, i.e., the likelihood of discontinuities and lifetest failures. Any film thicker than about 100 Angstroms is unsatisfactory because it gives rise to a significant tunneling resistance, thus impeding the current transport by quantum mechanical tunneling, and is therefore inconsistent with the concept of the invention.

The nonconductive film consists of any chemically stable material having a bulk resistivity several orders of magnitude greater than the semiconductor used, and being capable of formation into a thin adherent film. Suitable examples for interface layers on silicon include silicon oxides, silicon nitrides, silicon carbide, aluminum oxide, amorphous silicon, organic material such as photoresist, or other polymerized material composed of any interconnected carbon hydride chains. For semiconductors other than silicon, the interface layer is composed of the analogous compounds, amorphous modification, or polymerized organic material.

The film of conductor is usually a metal including, for example, aluminum, chromium, gold, molybdenum, tungsten, and platinum. The metallic conductor can also be any combination or inter-metallic compound of metals, or whatever combination of metals and nonmetals is desired from a technological and processing standpoint. An important feature of the invention is that it makes the contacting process independent of the choice of metal.

A further aspect of the invention is embodied in a process for the fabrication of a semiconductor contact structure comprising the steps of forming an adherent uniform film of nonconductor 10–100 Angstroms thick on a selected portion of a surface body of a semiconductor body, and then forming an adherent conductive film on the nonconductor film.

The process embodiments of the invention are also applicable to all known semiconductors, including specifically the examples named above. Similarly, it is contemplated that the choice of nonconductor and conductive films for the process is the same as for the structure, including each of the examples named above. As a practical matter, the process must begin with a thorough cleaning of the selected semiconductor surface. All residual contaminants have to be removed to the state of the art routinely employed in semiconductor production, in order to ensure the continuity and uniformity of the nonconductor film formed thereon. It is an important aspect of the invention that cleaning and activation are preferably achieved by ion bombardment, including argon ion bombardment, for example. Bombardment with other ions is equally suitable, including helium, neon, or krypton.

This bombardment fulfills a twofold purpose: cleaning and activation. As stated above, the cleaning action removes absorbed impurities, residuals, or any foreign material from the surface of the semiconductor exposed to the bombardment. It also removes by sputtering action a few near-surface layers of the semiconductor itself, which is a desirable effect, since these near-surface layers may contain unwanted lattice defects or other disturbances.

The activation is achieved by leaving the surface atoms with unsaturated chemical bonds which renders them very active chemically. In this state, the surface atoms are eager to form compounds such as oxides or nitrides, a property which is utilized in the interface-layer-forming step following immediately after the cleaning step.

It should be noted, however, that an ion bombardment using ions of energies in the keV range may permanently disturb the single crystallinity of the semiconductor lattice by introducing numerous lattice disorders up to the point where a near-surface film of the semiconductor is transformed into the amorphous configuration. The amorphous layer contains a high density of energy states in the forbidden energy range of the undisturbed semiconductor, and therefore represents an interface layer in accordance with one embodiment of this invention. On the other hand, because of possible thermo-dynamic instabilities of such a layer, it is intended for purposes of cleaning only to keep the thickness of the amorphous or disturbed layer at a minimum by using ions having low enough energy, or by choosing a substrate distance from the high voltage electrodes in the glow discharge chamber great enough to make the bombardment only a mild one. In summary, an experimental compromise (substrate exposure time and voltage at electrodes) is found for the particular geometry used in the glow discharge or sputtering apparatus in order to reach the ion energy and exposure time needed for the surface cleaning action, consistent with minimum lattice damage done to the cleaned semiconductor surface.

In a preferred embodiment of the invention, the surface cleaning and activating procedure is followed by a glow discharge with another species of ionized gases, for instance oxygen or nitrogen. This bombardment generates the thin, uniform, and stable nonconducting interface layer between the semiconductor and the metal. In another modification, an exposure of the freshly cleaned semiconductor surface to a glow discharge in a vapor of reduced pressure of organic material, such as photoresist or monocarbonic acids, produces the interface layer.

Figure 1:
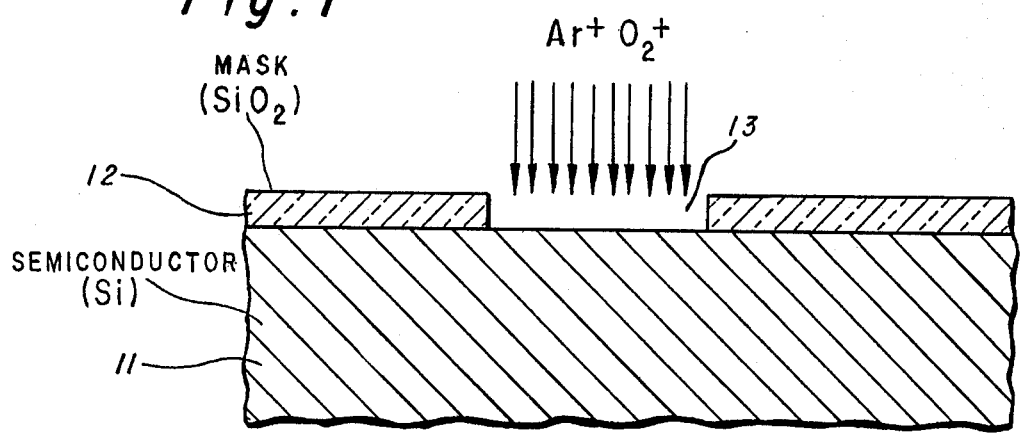
FIG. 1 is a fragmentary cross-sectional view of an oxide-masked silicon wafer, illustrating the processes of the invention.
Figure 2:
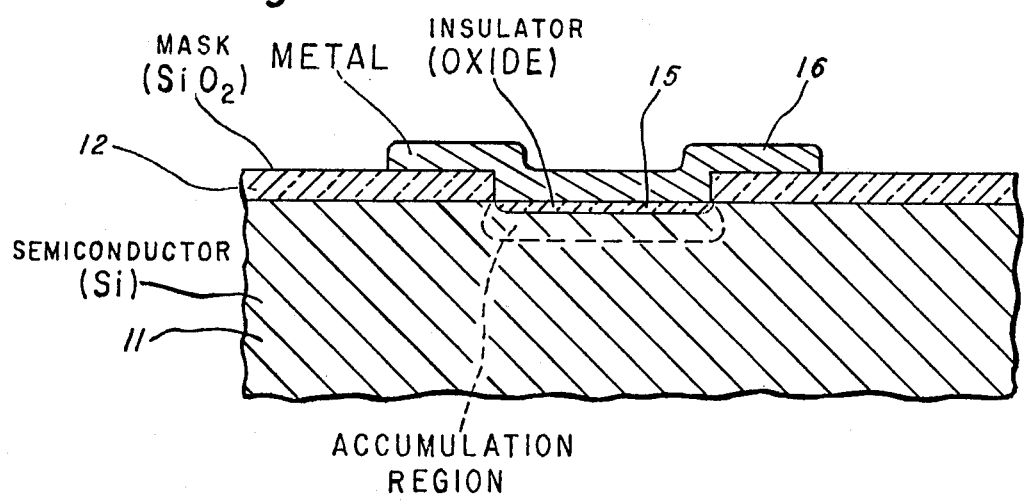
FIG. 2 is a fragmentary cross-sectional view of the wafer shown in FIG. 1, after completion of a metal-semiconductor contact structure in accordance with an embodiment of the invention.

As shown in FIG. 1, silicon wafer 11, of n- or p-type conductivity, bulk or epitaxial material, is provided with a suitable masking layer 12, having one or more windows 13 provided therein by known photolithographic techniques. The wafer is then transferred to a vacuum chamber and exposed to argon ion bombardment for the purpose of removing any contaminants from the semiconductor surface, whereby the surface of the silicon is chemically activated.

After cleaning and activation the wafer is subjected to bombardment by oxygen ions under carefully controlled conditions for a time sufficient to form silicon oxide layer 15, having a thickness of 10–100 Angstroms, preferably 15–40 Angstroms, in the masked window. The exact bombardment times required to achieve the desired result will depend, of course, upon the number and the energy of the impinging ions, which depends upon the distance of the wafer from the electrodes and the voltage of the discharge at the electrodes. For example, where the voltage is in the range of 1,000–10,000 volts, the wafer is subjected to argon glow for 5–20 minutes, and is then subjected to oxygen glow for 10–60 seconds. Suitable gas pressures used under these conditions are $10^{-3}$ to $10^{-1}$ Torr.

Other cleaning methods and other oxidation techniques are also useful including, for example, the use of a wet chemical etch for cleaning the semiconductor surface, followed by exposure to ambient oxygen for oxidation for short periods at elevated temperatures. It will be apparent, however, that cleaning by ion bombardment is superior since no residual film of contaminants remains on the semiconductor surface. Furthermore, the use of oxygen ion bombardment to form the oxide layer is preferred since extremely careful control over the uniformity and thickness of the oxide layer is thereby achieved.

After the formation of the oxide layer, the deposition of the metal layer, 16 (for example, aluminum), preferably in the same vacuum equipment without breaking the vacuum, is begun. The metallization is achieved by known methods including evaporation or sputtering. One advantage of the invention is that it provides a very wide choice of metals due to the elimination of any need for metal-semiconductor annealing. That is, the metallurgical compatibility constraint is removed. Suitable metals include those named above.

The following example of the invention illustrates the characteristics of metal-semiconductor contacts produced in accordance with the invention, without contact diffusion and without annealing. Extremely low specific contact resistance is obtained, as contrasted with the Schottky barrier behavior obtained by direct metallization, even with contact diffusion and with annealing. The procedure used was as follows:

N-type silicon material of 5 ohm-cm resistivity was oxidized in the conventional steam oxidation technique. A window was opened (½ mil diameter) using standard photoresist techniques. This sample was thoroughly cleaned using chemical etchants and rinsed in the deionized water before it was transferred to a vacuum system. In this system, the sample was mounted on a substrate holder opposite the high voltage electrode. The system was pumped down to a residual gas pressure of $5 \times 10^{-7}$ Torr and then filled with argon gas to a pressure of $1 \times 10^{-2}$ Torr. A glow discharge was started by applying 1000 volts between electrodes. During the first 10 minutes of this argon glow, a shutter protected the sample. After these 10 minutes, the shutter was opened and the sample exposed to the argon glow for another 10 minutes. Immediately after extinction of the argon glow, the argon gas was pumped out of the vacuum system which was then refilled with oxygen gas to a pressure of $1 \times 10^{-2}$ Torr. An oxygen glow was started under the same conditions as the argon glow. The shutter protecting the sample remained closed for 1 minute and was then opened for 20 seconds. After this sequence, the oxygen was pumped out of the system and an aluminum film was sputtered onto the sample in the same vacuum system using conventional sputtering techniques.

Specific contact resistance achieved in the sample described, without metal-semiconductor annealing, was $5 \times 10^{-5}$ ohm-$cm^2$. In other samples, 10 ohm-cm n-type silicon was used for aluminum metallization and a specific contact resistance of $5 \times 10^{-5}$ ohm-$cm^2$ was achieved. Linear I–V characteristics for current densities up to $10^3$ A/$cm^2$ were observed for both the above described samples. These results are at least two orders of magnitude better than any data published for silicon of this high resistivity.

Typical applications of the invention are metal contacts to be applied to discrete silicon, germanium, and gallium arsenide devices such as power transistors, small signal devices, microwave devices, diodes, light-emitting structures, and sensors. Further applications are all integrated circuits, digital and linear circuits, and hybrid devices, where contacts have to be made to a multiplicity of semiconductor surfaces exhibiting various conductivities and resistivities. As an example, the fabrication of a silicon digital integrated circuit, which is characterized by a p-type base diffused into an n-type epitaxial collector, is simplified when the metal contacts are applied simultaneously to the appropriate window openings of n- and p-type silicon of different resistivities. The invention permits just that by exposing all windows to an argon glow discharge followed by an interface formation in oxygen glow discharge and metal evaporation.

Although it is far more common to fabricate monocrystalline semiconductor devices, there is an emerging trend of increasing importance attached to polycrystalline semiconductor devices. The present invention includes the fabrication of ohmic contacts to polycrystalline semiconductors, including polycrystalline silicon, for example, using the same sequence of steps described above for monocrystalline semiconductors.

What is claimed is:

1. A process for the fabrication of a semiconductor ohmic contact structure comprising the steps of:
   a. exposing a selected portion of a semiconductor body to a glow discharge in the presence of an inert gas;
   b. then exposing said selected portion to a glow discharge in oxygen or nitrogen, at conditions selected to form an adherent uniform film of nonconductor 10–100 Angstroms thick on said selected portion of the semiconductor body; and then
   c. forming an adherent film of conductor on said nonconductor film, to complete a contact structure having linear I–V characteristics.

2. A process as defined by claim 1 wherein said semiconductor is single or polycrystalline silicon of p-type conductivity.

3. A process as defined by claim 1 wherein said semiconductor is single or polycrystalline silicon of n-type conductivity.

4. A process as defined by claim 1 wherein the nonconductor film has a thickness of 15–40 Angstroms.

5. A process as defined by claim 1 wherein said semiconductor is Ge, a III–V compound, a II–VI compound, or a IV–VI compound.

6. A process as defined by claim 1 wherein said semiconductor body is first subjected to a cleaning treatment by ion bombardment, and wherein the nonconductor film is also formed by ion bombardment.

7. A process as defined by claim 6 wherein the cleaning is achieved by argon ion bombardment.

8. A process as defined by claim 7 wherein the nonconductor is formed by oxygen-ion bombardment.

9. A process as defined by claim 1 wherein said semiconductor body is first subjected to a chemical cleaning treatment, and wherein the nonconducting film is formed by ambient oxidation.

10. A semiconductor ohmic contact structure produced by the process of claim 1.

11. A semiconductor ohmic contact structure produced by the process of claim 2.

12. A semiconductor ohmic contact structure produced by the process of claim 3.

13. A semiconductor ohmic contact structure produced by the process of claim 5.

14. A semiconductor ohmic contact structure produced by the process of claim 8.

15. A semiconductor ohmic contact structure produced by the process of claim 9.

* * * * *